United States Patent [19]
Kellam

[11] Patent Number: 5,536,959
[45] Date of Patent: Jul. 16, 1996

[54] SELF-ALIGNED CHARGE SCREEN (SACS) FIELD EFFECT TRANSISTORS AND METHODS

[75] Inventor: Mark D. Kellam, Chapel Hill, N.C.

[73] Assignee: MCNC, Research Triangle Park, N.C.

[21] Appl. No.: 303,698

[22] Filed: Sep. 9, 1994

[51] Int. Cl.$^6$ .......................... H01L 29/76; H01L 21/265
[52] U.S. Cl. .......................... 257/327; 257/336; 257/345; 257/401; 437/40
[58] Field of Search ...................................... 257/327, 335, 257/336, 344, 345, 408, 611; 437/40, 45

[56] References Cited

U.S. PATENT DOCUMENTS

| | | | |
|---|---|---|---|
| 4,636,822 | 1/1987 | Codella et al. | 357/22 |
| 4,656,492 | 4/1987 | Sunami et al. | 357/23.3 |
| 4,703,551 | 11/1987 | Szluk et al. | 437/30 |
| 4,837,173 | 6/1989 | Alvis et al. | 437/24 |
| 4,928,156 | 5/1990 | Alvis et al. | 357/23.4 |
| 4,956,311 | 9/1990 | Liou et al. | 437/57 |
| 5,031,008 | 7/1991 | Yoshida | 357/23.3 |
| 5,040,037 | 8/1991 | Yamaguchi et al. | 357/23.7 |
| 5,108,940 | 4/1992 | Williams | 437/44 |
| 5,219,777 | 6/1993 | Kang | 437/44 |
| 5,243,212 | 9/1993 | Williams | 257/344 |
| 5,244,823 | 9/1993 | Adan | 437/41 |
| 5,264,380 | 11/1993 | Pfiester | 437/37 |
| 5,290,714 | 3/1994 | Onozawa | 437/27 |
| 5,359,221 | 10/1994 | Miyamoto et al. | 257/345 |

FOREIGN PATENT DOCUMENTS

| | | |
|---|---|---|
| 6-237002 | 8/1994 | Japan . |
| WO94/19830 | 9/1994 | WIPO . |

OTHER PUBLICATIONS

Zhi–Hong Liu, et al., *Threshold Voltage Model for Deep-Submicrometer MOSFET's*, IEEE Transactions on Electron Devices, vol. 40, No. 1, Jan. 1993, pp. 86–95.

Yoshinori Okumura, et al., *Source–to–Drain Nonuniformly Doped Channel (NUDC) MOSFET Structures for High Current Drivability and Threshold Voltage Controllability*, IEEE Transactions on Electron Devices, vol. 39, No. 11, Nov. 1992, pp. 2541–2552.

James E. Chung, et al., *Performance and Reliability Design Issues for Deep–Submicrometer MOSFETS*, IEEE Transactions on Electron Devices, vol. 38, No. 3, Mar. 1991, pp. 545–554.

Eiji Takeda, et al., *Constraints on the Application of 0.5–μm MOSFET's to ULSI Systems*, IEEE Transactions on Electron Devices, vol. ED–32, No. 2 Feb. 1985, pp. 322–327.

J. R. Brews, et al., *Generalized Guide for MOSFET Miniaturization*, IEEE Electron Device Letters, vol. EDL–1, No. 1, Jan 1980.

Hisayo Sasaki, et al., *Hot–Carrier Induced Drain Leakage Current in N–Channel MOSFET*, IEEE, 1987, pp. 726–729.

T. Y. Chan, et al., *The Impact of Gate–Induced Drain Leakage Current on MOSFET Scaling*, IEEE, 1987, pp. 718–721.

(List continued on next page.)

*Primary Examiner*—Mark V. Prenty
*Attorney, Agent, or Firm*—Bell, Seltzer, Park & Gibson

[57] ABSTRACT

A field effect transistor includes a pair of buried centroid regions in a semiconductor substrate at a predetermined depth from the substrate face and having a doping concentration opposite the source and drain regions. A gradient region surrounds each of the pair of buried centroid regions. The gradient regions have decreasing doping concentration in all directions away from the associated centroid region. Source and drain extension regions may also be provided. The buried centroid/gradient regions operate to screen charge on the source and drain regions facing the channel to prevent this charge from interacting with the channel. Short channel effects are thereby reduced or minimized. The threshold voltage of the device can also be adjusted without the need for threshold adjusting implants. The buried centroid/gradient regions and source and drain extension regions may be fabricated in a self-aligned process using the gate and gate sidewall spacers as a mask.

23 Claims, 5 Drawing Sheets

OTHER PUBLICATIONS

Chi Chang, et al., *Corner–Field Induced Drain Leakage in Thin Oxide MOSFETs*, IEEE, 1987.

Christopher F. Codella, et al., *Halo Doping Effects in Submicron DI–LDD Device Design*, IEEE, 1985, pp. 230–233.

John R. Brews, *Threshold Shifts Due to Nonuniform Doping Profiles in Surface Channels MOSFET's*, IEEE Transactions on Electron Devices, vol. ED–26, No. 11, Nov. 1979.

W. Fichtner, et al., *MOS modelling by analytical approximations*, Int. J. Electronics, vol. 46, No. 1, 1979, pp. 33–55.

SELF-ALIGNED CHARGE SCREEN (SACS) FIELD EFFECT TRANSISTORS AND METHODS

FIELD OF THE INVENTION

This invention relates to field effect transistors, and more particularly to integrated circuit field effect transistors.

BACKGROUND OF THE INVENTION

One of the continuing goals of the semiconductor industry is the production of smaller microelectronic devices and denser integrated circuits. As device size shrinks and denser integrated circuits are fabricated, the speed of the devices generally increases, and the power consumption per device generally decreases. Moreover, the number of devices which may be fabricated in an integrated circuit generally increases. Accordingly, much development effort has concentrated on shrinking integrated circuit device dimensions into the submicron range.

The field effect transistor (FET) is an important microelectronic device. As is well known to those having skill in the art, a field effect transistor includes spaced-apart source and drain regions in a semiconductor substrate at a face thereof and a gate on the semiconductor substrate face between the spaced-apart source and drain regions. The field effect transistor also includes a channel in the semiconductor substrate under the gate, between the spaced-apart source and drain regions.

In order to shrink integrated circuit field effect transistor dimensions, much effort has been focused on shrinking the length of the channel between the source and drain regions. However, it has been found that as channel length is reduced to below one micron, to produce "short" channels, departures from conventional long channel behavior may occur. These departures, known as "short channel effects", arise as a result of the two dimensional potential distribution and high electric fields in the channel region.

Short channel effects include a large variation of threshold voltage with processing variations, degradation of subthreshold behavior, decreased saturation current due to punch through, decreased channel mobility, hot carrier injection and other well-known effects. General discussions of short channel effects are contained in publications entitled *"Generalized Guide for MOSFET Miniaturization"*, Brews et al., IEEE Electron Device Letters, Vol. EDL-1, No., January 1980, pp. 2–4; *"Constraints on the Application of 0.5 µm MOSFET's to ULSI Systems"*, Takeda et al., IEEE Transactions on Electron Devices, Vol. ED-32, No. 2, February 1985, pp. 322–327; *"Performance and Reliability Design Issues for Deep-Submicrometer MOSFET's"*, Chung et al., IEEE Transactions on Electron Devices, Vol. 38, No. 3, March 1991, pp. 545–554; and *"Threshold Voltage Model for Deep-Submicrometer MOSFET's"*, Liu et al., IEEE Transactions on Electron Devices, Vol. 40, No. 1, January 1993, pp. 86–95.

In an attempt to reduce or compensate for short channel effects, many short channel FET structures have been developed. Many of these structures provide a channel implant at the substrate surface in order to adjust the threshold of the FET. Other structures include a nonuniformly doped channel by adding extensions of the source and/or drain regions into the channel. Combinations of surface channel implants and source/drain extensions have also been used. See, for example, U.S. Pat. No. 4,636,822 to Codella et al. entitled *"GaAs Short Channel Lightly Doped Drain MESFET Structure and Fabrication"*; U.S. Pat. No. 5,031,008 to Yoshida entitled *"MOSFET Transistor"*; U.S. Pat. No. 5,219,777 to Kang entitled *"Metal Oxide Semiconductor Field Effect Transistor and Method of Making the Same"*; U.S. Pat. No. 5,244,823 to Adan entitled *"Process for Fabricating a Semiconductor Device"*; and an article entitled *"Source-to-Drain Nonuniformly Doped Channel (NUDC) MOSFET Structures for High Current Drivability and Threshold Voltage Controllability"* to Okumura et al., IEEE Transactions on Electron Devices, Vol. 39, No. 11, November 1992, pp. 2541–2551. Unfortunately, a surface channel implant decreases the allowed thermal budget of the transistor. Other structural modifications for short channel devices have not effectively reduced or eliminated short channel effects, or produce other undesirable effects. Such short channel devices may also present significant fabrication or yield problems.

SUMMARY OF THE INVENTION

It is therefore an object of the invention to provide improved integrated circuit field effect transistors and methods of fabricating the same.

It is another object of the invention to provide improved short channel field effect transistors and methods of fabricating the same.

It is yet another object of the present invention to provide improved short channel field effect transistors and methods of fabricating the same which do not require surface channel implants to control threshold voltage.

These and other objects are provided, according to the present invention, by a Self-Aligned Charge Screen (SACS) field effect transistor having spaced-apart source and drain regions of first conductivity type in a semiconductor substrate, at a face thereof, and further including a first ("buried centroid") region in the semiconductor substrate having a first predetermined doping concentration of second conductivity type, and which extends from the source region towards the drain region at a first predetermined depth from the substrate face. A second ("gradient") region surrounds the first region. The second region has decreasing doping concentration of the second conductivity type from the first region towards the substrate face, from the first region away from the substrate face and from the first region towards the drain region. Thus, a source "buried centroid/gradient" region is formed.

A field effect transistor according to the present invention also includes a third (buried centroid) region in the semiconductor substrate, having a second predetermined doping concentration of the second conductivity type and extending from the drain region towards the source region at a second predetermined depth from the substrate face. A fourth (gradient) region surrounds the third region, with the fourth region having decreasing doping concentration of the second conductivity type from the third region towards the substrate face, from the third region away from the substrate face and from the third region towards the drain region. A drain buried centroid/gradient region is thereby formed.

The first and second predetermined doping concentrations may be equal to each other and the first and second predetermined depths may be equal to each other. The first and second predetermined depths are preferably about one-half the depth of the source region and drain region, respectively.

The buried centroid/gradient regions operate to screen the charge on the source and drain regions facing the channel, and prevent this charge from interacting with the channel.

Short channel effects are thereby reduced or eliminated. Moreover, the first and second doping concentrations and the dimensions and gradient in the second and fourth regions can be adjusted in order to adjust the threshold voltage of the device, without the need for threshold adjusting implants. An improved short channel transistor is thereby provided.

In a preferred embodiment, the field effect transistor also includes a source extension region of the first conductivity type in the semiconductor substrate at the face, extending from the source region towards the drain region. The transistor also preferably includes a drain extension region of the first conductivity type in the semiconductor substrate at the face, which extends from the drain region towards the source region. The first and third (buried centroid) regions are formed below the source extension region and drain extension region respectively, and the second and fourth regions have decreasing doping concentration towards and away from the source and drain extension regions, respectively. The source extension region and drain extension region are typically lightly doped relative to the source region and the drain region, respectively.

As is known to those having skill in the art, a field effect transistor gate typically includes a gate insulator on the substrate face between the spaced-apart source and drain regions, and a gate contact on the gate insulator opposite the substrate face. According to the invention, both the source extension region and the drain extension region preferably extend to under the gate of the substrate face. Moreover, the gate includes a first gate sidewall adjacent the source region and a second gate sidewall adjacent the drain region. A source sidewall spacer is located on the first gate sidewall and extends onto the substrate face. A drain sidewall spacer is located on the second gate sidewall and extends onto the substrate face. According to the invention, the source region extends to under the source sidewall spacer at the substrate face and the drain region extends to under the drain sidewall spacer at the substrate face.

A Self-Aligned Charge Screen (SACS) field effect transistor according to the present invention may be fabricated by forming a gate on a face of a semiconductor substrate. Using the gate as a mask, an implant is performed to form the source and drain extension regions. A buried implant of opposite conductivity is also performed, using the gate as a mask to form the first and third buried centroid regions and the second and fourth gradient regions. The energy and dose of the buried implant are selected in a manner known to those skilled in the art, to produce the requisite depth and doping density of the first and third buried centroid regions and the requisite gradient of the second and fourth gradient regions.

First and second sidewall spacers are then formed. The source and drain regions are then implanted by an implant using the gate and the sidewall spacers as a mask. The relative positions of the source/drain extension regions and the buried centroid/gradient regions may also be controlled by forming a first portion of the first and second sidewall spacers after implanting the source and drain extension regions and then implanting the centroid/gradient regions using the gate and first sidewall spacer portions as a mask. Second portions of the sidewall spacers may then be formed on the first portions, and the source and drain regions may be implanted using the gate and the first and second sidewall spacer portions as a mask.

Field effect transistors according to the present invention can reduce or eliminate short channel effects and provide high channel mobilities due to reduced vertical fields and minimum impurity scattering. Independent control of short channel behavior and threshold voltage may also be obtained. Deeper source and drain junctions and larger thermal budgets may also be provided because the surface channel implant to control threshold is no longer needed.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1:
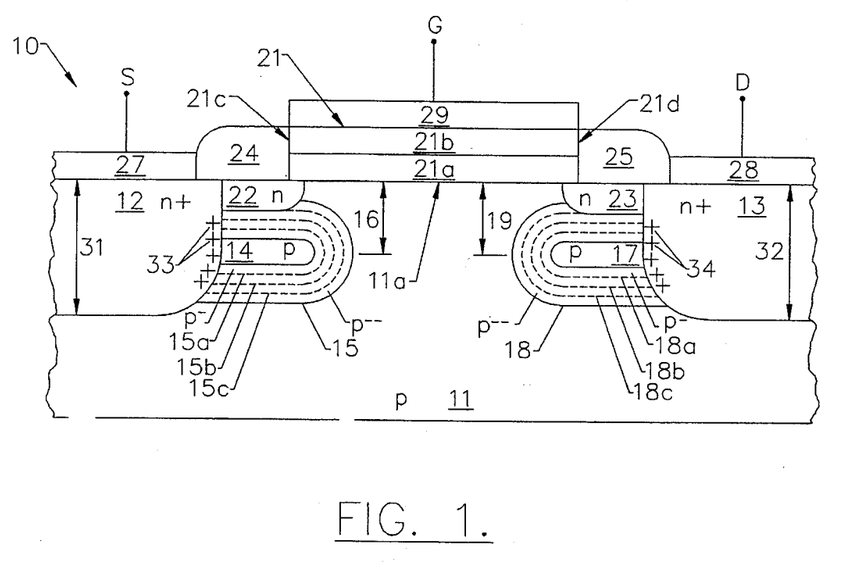
FIG. 1 is a cross-sectional view of a Self-Aligned Charge Screen (SACS) field effect transistor according to the present invention.

Referring now to FIG. 1, a Self-Aligned Charge Screen (SACS) field effect transistor according to the present invention is illustrated. As shown in FIG. 1, transistor 10 is formed in a p-type semiconductor substrate 11. However, it will be understood by those having skill in the art that all conductivity types can be reversed.

Still referring to FIG. 1, spaced-apart source and drain regions of 12 and 13, of first conductivity type, here n+, are formed in the semiconductor substrate 11 at a face 11a thereof. Source region 12 has a depth 31 and drain region 13 has a depth 32. The source and drain regions are preferably highly doped, for example at a concentration of $2 \times 10^{20}$ dopants/cm$^3$ or greater. A first region 14 is formed in the semiconductor substrate having a first predetermined doping concentration of second conductivity type, here p-type, and extending from the source region 12 towards the drain region 13 at a first predetermined depth 16 from substrate face 11a. First region 14 is also referred to as a "first buried centroid region" because of the shape thereof.

A second region 15 surrounds the first region 14. The second region has a decreasing doping concentration of the second conductivity type from the first region towards the substrate face 11a, from the first region away from the substrate face, and from the first region towards the drain region 13. Second region 15 is also referred to as a "second gradient region" because it has a doping gradient which decreases in all directions away from first region 14. For example, region 14 may have a doping concentration of $1 \times 10^{18}$/cm$^3$. Dotted lines 15a, 15b and 15c indicate doping concentrations of $1 \times 10^{17}$, $1 \times 10^{16}$ and $1 \times 10^{15}$, respectively. As such, the doping concentration drops from p– adjacent region 14, to p— in directions away from region 14, forming a negative gradient.

Still referring to FIG. 1, a third region 17 is formed in the semiconductor substrate 11. Third region 17 has a second predetermined doping concentration of the second conductivity type and extends from the drain region 13 towards the source region 12 at a predetermined depth 19 from the substrate face. The third region is also referred to as a "third buried centroid region". A fourth region 18 surrounds the third region 17 and has a decreasing doping concentration of the second conductivity type from the third region towards the substrate face, from the third region away from the substrate face, and from the third region towards the drain region. Third region 18 is also referred to as a "third gradient region".

It will be understood by those having skill in the art that the field effect transistor 10 may include only first and second regions 14 and 15 respectively, or only third and fourth regions 17 and 18 respectively. It will also be understood that the first and second predetermined depths 16 and 19 may be equal to one another; the first and second predetermined doping concentrations may be equal to one another; and the doping gradients in the second and fourth regions may be equal to one another so that a symmetrical transistor is produced relative to the source and drain.

Still referring to FIG. 1, transistor 10 also includes a gate 21 having a gate insulator 21a adjacent substrate face 11a and a gate contact 21b, typically a polycrystalline silicon gate contact, on gate insulator 21a opposite face 11a. Source, drain and gate electrodes 27, 28 and 29 respectively, contact source drain and gate 12, 13 and 21 respectively.

Gate 21 includes a first gate sidewall 21c adjacent the source region 12, and a second gate sidewall 21d adjacent drain region 13. A first gate sidewall spacer 24 extends from first sidewall 21c onto substrate face 11a such that source 12 extends under first gate sidewall spacer 24. Similarly, second gate sidewall spacer 25 extends from second sidewall 21d onto substrate face 11a such that drain 13 extends under second gate sidewall spacer 25.

Field effect transistor 10 also preferably includes a source extension region 22 of the first conductivity type, in the semiconductor substrate at the face 11a and extending from the source region 12 towards the drain region 13. A drain extension region 23 of the first conductivity type is also included in the semiconductor substrate face 11 and extending from the drain region towards the source region. The source and drain extension regions 22 and 23 respectively are preferably more lightly doped than source and drain regions 12 and 13. For example, they are preferably doped at $5\times10^{19}/cm^3$ and, as such, are labelled n in FIG. 1. For a typical short channel device, having a channel length of 0.25 μm, typical depths 31 and 32 are 0.2 μm, typical depths 16 and 19 are 0.1 μm and typical depths of regions 22 and 23 are 0.6 μm. Regions 14 and 17 typically extend about 0.1 μm from the source and drain respectively, and a typical thickness of regions 15a, 15b, 15c, 18a, 18b, and 18c is about 0.5 μm, to provide a doping gradient.

In operation, first buried centroid region 14 and second gradient region 15 act to screen charge 33 which is formed in the source region 12 facing drain region 13. Similarly, third buried centroid region 17 and fourth gradient region 18 act to shield charge 34 which forms in drain region 13 facing source region 12. In order to optimize this shielding of charge, the depth 16 of first buried centroid region 14 is preferably half the depth 31 of source 12 and the depth 19 of third buried centroid region 17 is preferably half the depth 32 of drain region 13. Since the source and drain regions typically have the same depth, the first and third buried centroid regions also preferably have the same depth. Accordingly, cancellation of short channel effects are provided and high channel mobilities are provided due to reduced vertical field and reduced impurity scattering.

Moreover, the depth and doping concentration of first and third buried centroid regions 14 and 17, and the size and negative dopant gradient of second and fourth gradient regions 15 and 18 may be varied to independently control short channel behavior and threshold voltage. The selection of geometries, doping levels and doping gradients may be performed empirically or with the use of a simulator and will depend on the other device dimensions and desired properties. Finally, since a surface channel implant is not required to set the threshold voltage, a return to deeper junctions and larger thermal budgets may be provided even at very short channel lengths.

Referring now to FIGS. 2A–2D, a first method for fabricating a field effect transistor according to the present invention will be described. As shown, gate 21 is formed on face 11a of substrate 11 using conventional techniques. As will be understood by those having skill in the art, the gate typically includes an insulating or oxide layer 21a and a gate contact 21b typically formed of polycrystalline silicon. The fabrication of gate 21 is well known to those having skill in the art and need not be described further. It will also be understood by those having skill in the art that device isolation regions such as recessed oxide isolation or other known isolation regions are also typically formed prior to forming gate 21.

Figure 2A:
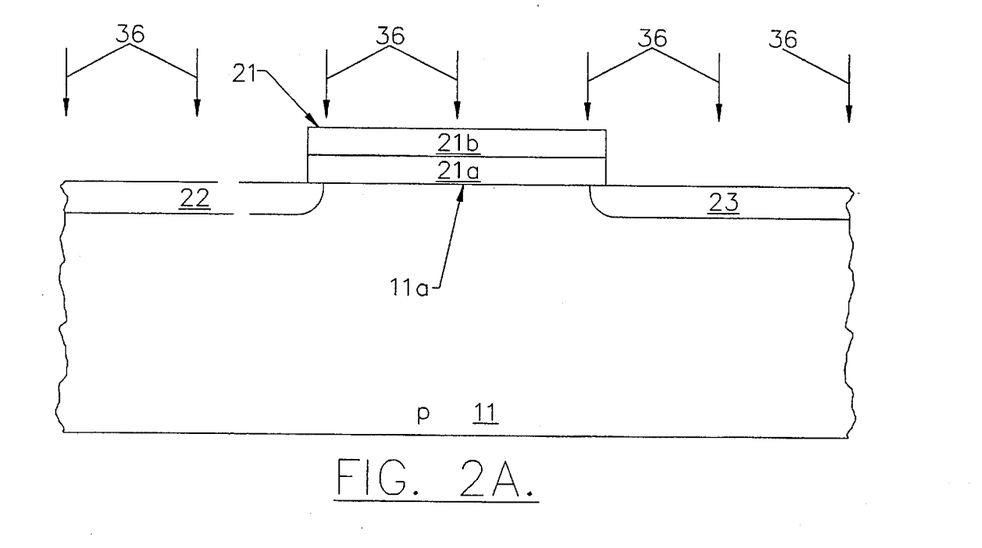
FIGS. 2A–2D are cross-sectional views of the transistor of FIG. 1 during intermediate fabrication steps.

As shown in FIG. 2A, an implant of ions 36 is performed using gate 21 as a mask to form source extension region 22 and drain extension region 23. For example, a shallow arsenic ion implant to produce a 500 Å depth and a doping of $5\times10^{19}/cm^3$ may be performed. The dosage and energy of arsenic to form such a region are well known to those having skill in the art.

Figure 2B:
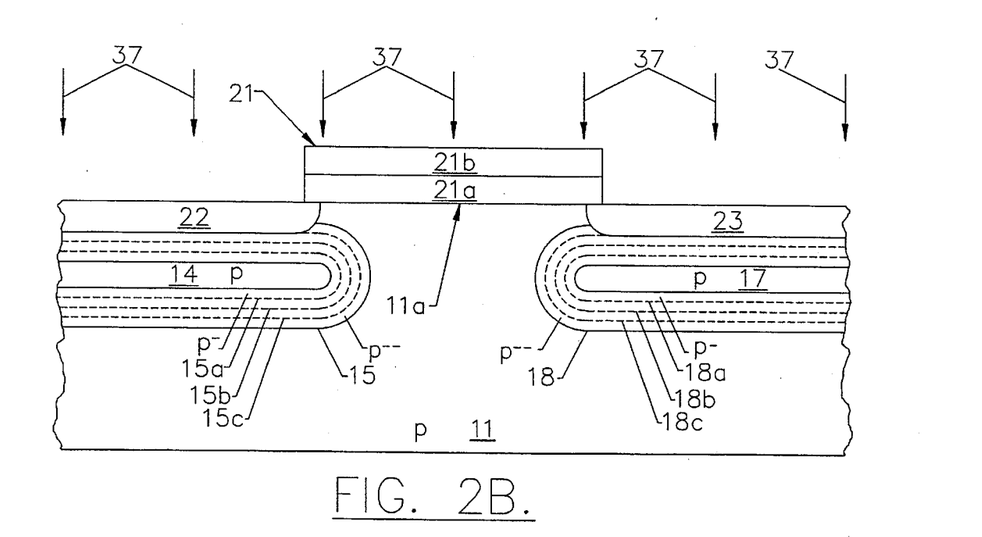

Referring to FIG. 2B, an implant of ions 37, for example boron, is performed, using gate 21 as a mask. A proper dose and energy of boron to produce a peak doping concentration in regions 14 and 17 of about $1\times10^{18}/cm^3$ and a gradient as was described with respect to FIG. 1, is well known to those having skill in the art. It will also be understood that an anneal may be performed to cause a slight amount of diffusion of regions 14–18, if desired. It will also be understood that since the gate is used for both implantation steps (FIGS. 2A and 2B), the regions formed thereby are self-aligned to one another and to the ultimate transistor structure. Finally, it will also be understood that the order of the implants 36 and 37 may be reversed.

Figure 2C:
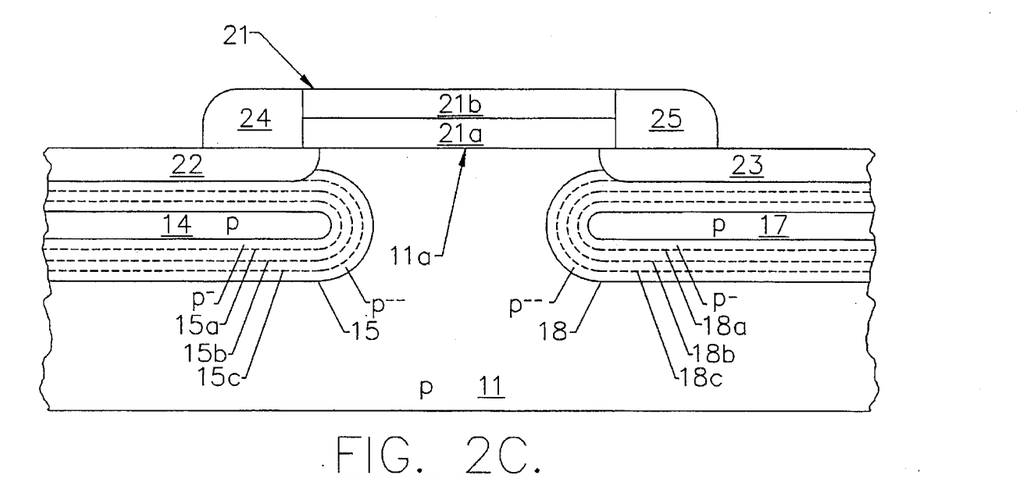

Referring now to FIG. 2C, first gate sidewall spacer 24 and second gate sidewall spacer 25 may be formed using techniques well known to those having skill in the art. As also understood by those having skill in the art, the sidewall spacers may be formed of multiple materials, such as oxide-nitride spacers.

Figure 2D:
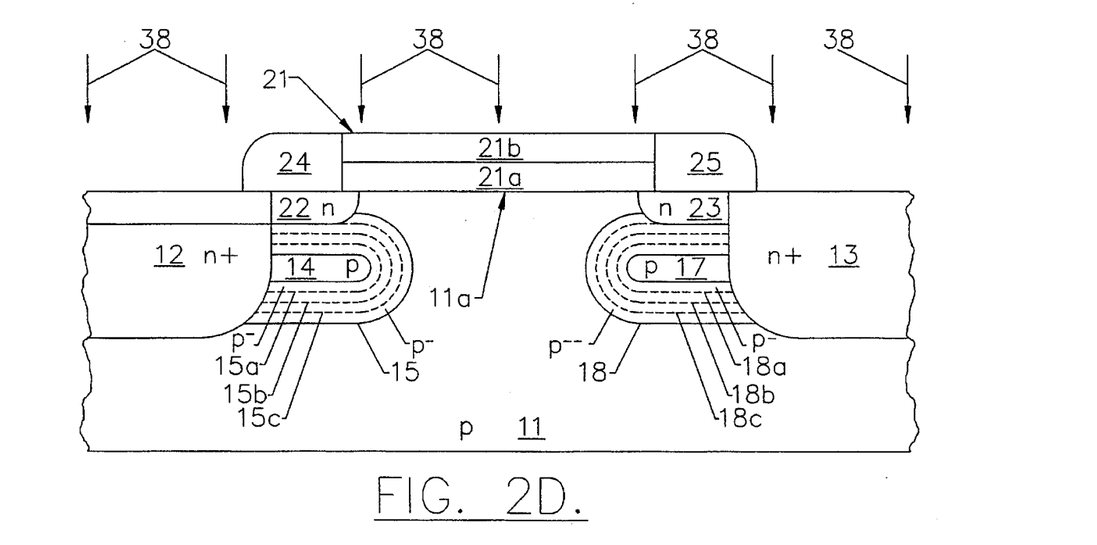

Then, referring to FIG. 2D, an implant of ions 38 is performed using the gate 21 and the sidewall spacers 24 and 25 as a mask to form source region 12 and drain region 13. Arsenic may be used at a predetermined dosage and density to provide the source and drain implants. Multiple implants may be performed if necessary, as is well known to those having skill in the art. Since the source and drain implants are formed using the gate 21 and sidewall spacers 24, 25 as a mask, they are self-aligned to the regions which were previously formed. Source, drain and gate electrodes may then be formed to form the transistor of FIG. 1, using conventional techniques.

Figure 3A:
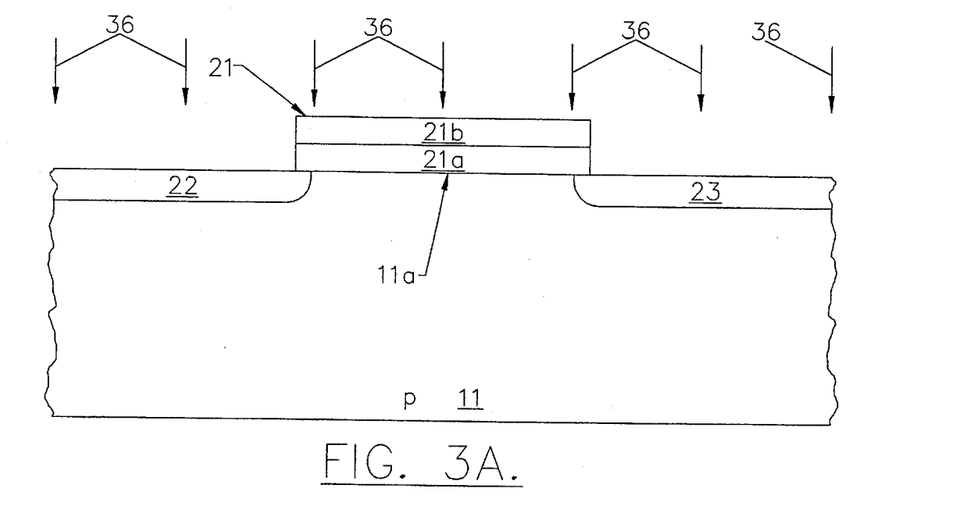
FIGS. 3A–3D are cross-sectional views of the transistor of FIG. 1 during intermediate fabrication steps according to a second fabrication method.
Figure 3B:
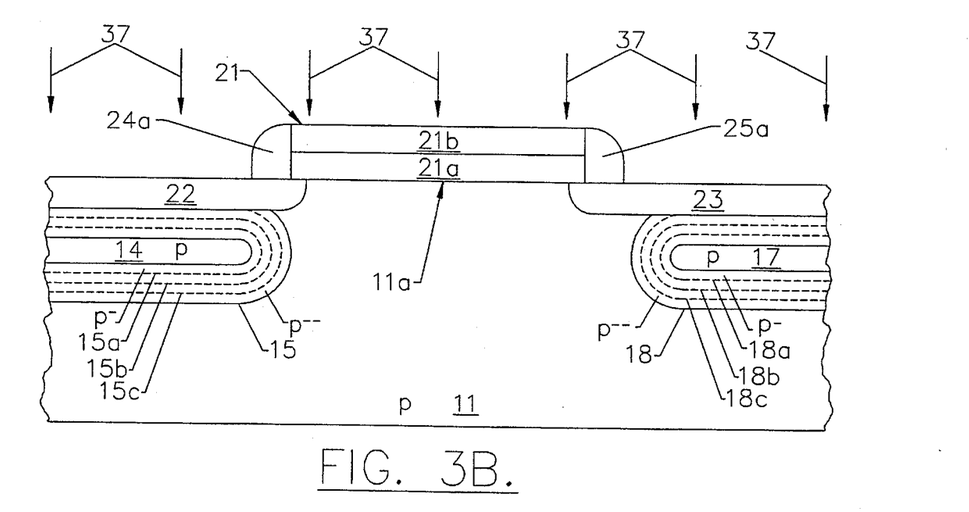
Figure 3C:
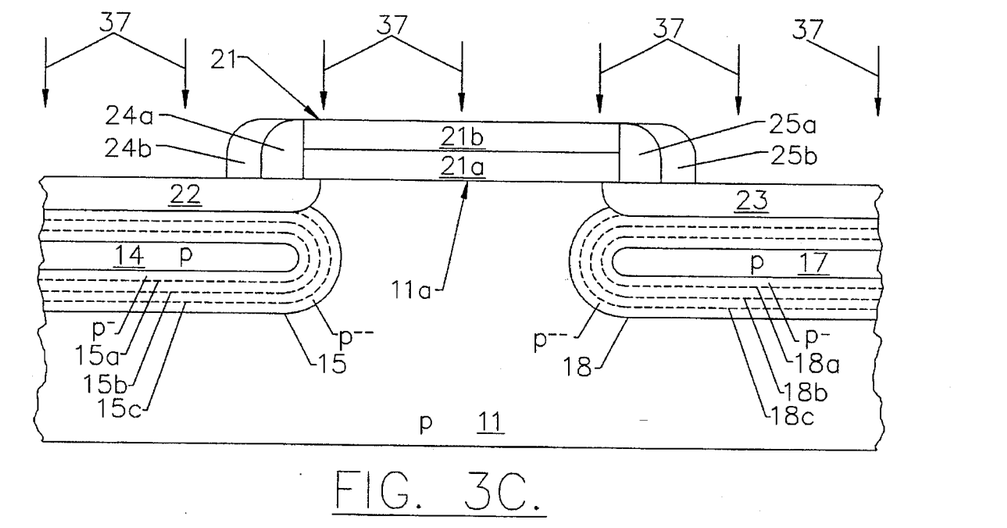
Figure 3D:
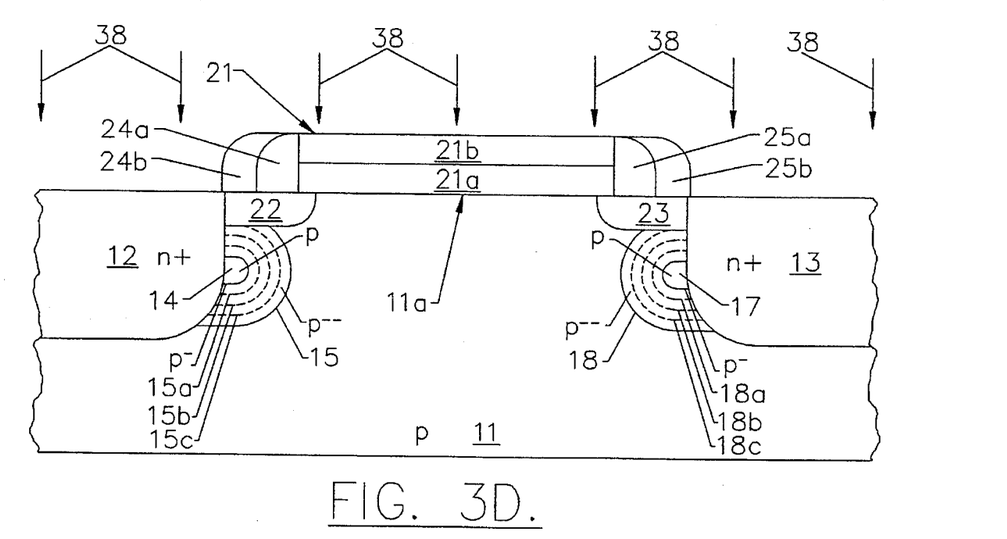

FIGS. 3A–3D illustrate an alternate embodiment for forming the transistor 10 of FIG. 1. In this embodiment, a first portion 24a, 25a of first and second sidewall spacers 24 and 25 respectively, are formed prior to performing implant 37. Thus, the lateral extent of the buried centroid and gradient regions 14, 16, 15 and 17 respectively, is controlled relative to the source and drain extensions 22 and 23 respectively. In FIG. 3C, second portions 24b, 25b of first and second sidewall spacers 24, 25 are then formed prior to performing the implant 38 in FIG. 3D. Thus, the lateral extent of the source and drain is also controlled relative to the previously formed regions.

The two step sidewall formation of FIGS. 3A–3D allow independent control of the location of the source and drain extensions 22 and 23 respectively, the buried centroid and gradient regions 14, 17, 15 and 18 respectively, and the source and drain regions 12 and 13 respectively.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:

a semiconductor substrate;

spaced apart source and drain regions of first conductivity type in said semiconductor substrate, at a face thereof;

a first region in said semiconductor substrate, having a first predetermined doping concentration of second conductivity type, and extending from said source region towards said drain region, at a first predetermined depth from said substrate face;

a second region surrounding said first region, said second region having decreasing doping concentration of said second conductivity type from said first region towards said substrate face, from said first region away from said substrate face and from said first region towards said drain region;

a third region in said semiconductor substrate, having a second predetermined doping concentration of said second conductivity type, and extending from said drain region towards said source region, at a second predetermined depth from said substrate face;

a fourth region surrounding said third region, said fourth region having decreasing doping concentration of said second conductivity type from said third region towards said substrate face, from said third region away from said substrate face and from said third region towards said drain region;

a gate on said semiconductor substrate face, between said spaced apart source and drain regions; and source, drain and gate electrodes for contacting said source and drain regions and said gate, respectively;

wherein said source region extends a third predetermined depth from said substrate face and said first predetermined depth is less than said third predetermined depth; and wherein said drain region extends a fourth predetermined depth from said substrate face and said second predetermined depth is less than said fourth predetermined depth.

2. A field effect transistor according to claim 1:

wherein said first and second predetermined doping concentrations are equal to each other; and wherein said first and second predetermined depths are equal to each other.

3. A field effect transistor comprising:

a semiconductor substrate;

spaced apart source and drain regions of first conductivity type in said semiconductor substrate, at a face thereof;

a first region in said semiconductor substrate, having a first predetermined doping concentration of second conductivity type, and extending from said source region towards said drain region, at a first predetermined depth from said substrate face;

a second region surrounding said first region, said second region having decreasing doping concentration of said second conductivity type from said first region towards said substrate face, from said first region away from said substrate face and from said first region towards said drain region;

a third region in said semiconductor substrate, having a second predetermined doping concentration of said second conductivity type, and extending from said drain region towards said source region, at a second predetermined depth from said substrate face;

a fourth region surrounding said third region, said fourth region having decreasing doping concentration of said second conductivity type from said third region towards said substrate face, from said third region away from said substrate face and from said third region towards said drain region;

a gate on said semiconductor substrate face, between said spaced apart source and drain regions; and source, drain and gate electrodes for contacting said source and drain regions and said gate, respectively;

wherein said source region extends a third predetermined depth from said substrate face and said first predetermined depth is about one half said third predetermined depth; and wherein said drain region extends a fourth predetermined depth from said substrate face and said second predetermined depth is about one half said fourth predetermined depth.

4. A field effect transistor comprising:

a semiconductor substrate;

spaced apart source and drain regions of first conductivity type in said semiconductor substrate, at a face thereof;

a first region in said semiconductor substrate, having a first predetermined doping concentration of second conductivity type, and extending from said source region towards said drain region, at a first predetermined depth from said substrate face;

a second region surrounding said first region, said second region having decreasing doping concentration of said second conductivity type from said first region towards said substrate face, from said first region away from said substrate face and from said first region towards said drain region;

a third region in said semiconductor substrate, having a second predetermined doping concentration of said second conductivity type, and extending from said drain region towards said source region, at a second predetermined depth from said substrate face;

a fourth region surrounding said third region, said fourth region having decreasing doping concentration of said second conductivity type from said third region towards said substrate face from said third region away from said substrate face and from said third region towards said drain region;

a gate on said semiconductor substrate face, between said spaced apart source and drain regions; and source, drain and gate electrodes for contacting said source and drain regions and said gate, respectively;

wherein said first and second predetermined doping concentrations are equal to each other;

wherein said first and second predetermined depths are equal to each other;

wherein said source region extends a third predetermined depth from said substrate face and said first predetermined depth is about one half said third predetermined depth; and wherein said drain region extends a fourth predetermined depth from said substrate face and said second predetermined depth is about one half said fourth predetermined depth.

5. A field effect transistor according to claim 1 wherein said gate comprises:

a gate insulator on said substrate face, between said spaced apart source and drain regions; and a gate contact on said gate insulator, opposite said substrate face, said gate electrode contacting said gate contact.

6. A field effect transistor comprising:

a semiconductor substrate;

spaced apart source and drain regions of first conductivity type in said semiconductor substrate, at a face thereof;

a source extension region of said first conductivity type in said semiconductor substrate at said face, and extending from said source region towards said drain region;

a drain extension region of said first conductivity type in said semiconductor substrate at said face, and extending from said drain region towards said source region;

a first region in said semiconductor substrate, having a first predetermined doping concentration of second conductivity type, and extending from said source region towards said drain region, at a first predetermined depth from said substrate face;

a second region surrounding said first region, said second region having decreasing doping concentration of said second conductivity type from said first region towards said source extension region, from said first region away from said source extension region and from said first region towards said drain region;

a third region in said semiconductor substrate, having a second predetermined doping concentration of second conductivity type, and extending from said drain region towards said source region, at a second predetermined depth from said substrate face;

a fourth region surrounding said third region, said fourth region having decreasing doping concentration of said second conductivity type from said third region towards said drain extension region, from said third region away from said drain extension region and from said third region towards said drain region;

a gate on said semiconductor substrate face, between said spaced apart source and drain regions; and source, drain and gate electrodes for contacting said source and drain regions and said gate, respectively;

wherein said source region extends a third predetermined depth from said substrate face and said first predetermined depth is less than said third predetermined depth; and wherein said drain region extends a fourth predetermined depth from said substrate face and said second predetermined depth is less than said fourth predetermined depth.

7. A field effect transistor according to claim 6:

wherein said first and second predetermined doping concentrations are equal to each other: and wherein said first and second predetermined depths are equal to each other.

8. A field effect transistor comprising:

a semiconductor substrate;

spaced apart source and drain regions of first conductivity type in said semiconductor substrate, at a face thereof;

a source extension region of said first conductivity type in said semiconductor substrate at said face, and extending from said source region towards said drain region;

a drain extension region of said first conductivity type in said semiconductor substrate at said face, and extending from said drain region towards said source region;

a first region in said semiconductor substrate, having a first predetermined doping concentration of second conductivity type, and extending from said source region towards said drain region, at a first predetermined depth from said substrate face;

a second region surrounding said first region, said second region having decreasing doping concentration of said second conductivity type from said first region towards said source extension region, from said first region away from said source extension region and from first region towards said drain region;

a third region in said semiconductor substrate, having a second predetermined doping concentration of second conductivity type, and extending from said drain region towards said source region, at a second predetermined depth from said substrate face;

a fourth region surrounding said third region, said fourth region having decreasing doping concentration of said second conductivity type from said third region towards said drain extension region, from said third region away from said drain extension region and from said third region towards said drain region;

a gate on said semiconductor substrate face, between said spaced apart source and drain regions; and source, drain and gate electrodes for contacting said source and drain regions and said gate, respectively;

wherein said source region extends a third predetermined depth from said substrate face and said first predetermined depth is about one half said third predetermined depth; and wherein said drain region extends a fourth predetermined depth from said substrate face and said second predetermined depth is about one half said fourth predetermined depth.

9. A field effect transistor comprising:

a semiconductor substrate;

spaced apart source and drain regions of first conductivity type in said semiconductor substrate, at a face thereof;

a source extension region of said first conductivity type in said semiconductor substrate at said face, and extending from said source region towards said drain region;

a drain extension region of said first conductivity type in said semiconductor substrate at said face, and extending from said drain region towards said source region;

a first region in said semiconductor substrate, having a first predetermined doping concentration of second conductivity type, and extending from said source region towards said drain region, at a first predetermined depth from said substrate face;

a second region surrounding said first region, said second region having decreasing doping concentration of said second conductivity type from said first region towards said source extension region, from said first region away from said source extension region and from said first region towards said drain region;

a third region in said semiconductor substrate, having a second predetermined doping concentration of second conductivity type, and extending from said drain region towards said source region, at a second predetermined depth from said substrate face;

a fourth region surrounding said third region, said fourth region having decreasing doping concentration of said second conductivity type from said third region towards said drain extension region, from said third region away from said drain extension region and from said third region towards said drain region;

a gate on said semiconductor substrate face, between said spaced apart source and drain regions; and source, drain and gate electrodes for contacting said source and drain regions and said gate, respectively;

wherein said first and second predetermined doping concentrations are equal to each other;

wherein said first and second predetermined depths are equal to each other;

wherein said source region extends a third predetermined depth from said substrate face and said first predetermined depth is about one half said third predetermined depth; and wherein said drain region extends a fourth predetermined depth from said substrate face and said second predetermined depth is about one half said fourth predetermined depth.

10. A field effect transistor according to claim 6 wherein said gate comprises:

a gate insulator on said substrate face, between said spaced apart source and drain regions; and a gate contact on said gate insulator, opposite said substrate face, said gate electrode contacting said gate contact.

11. A field effect transistor according to claim 6:

wherein said source extension region is lightly doped relative to said source region; and wherein said drain extension region is lightly doped relative to said drain region.

12. A field effect transistor according to claim 6:

wherein said source extension region extends to under said gate at said substrate face; and wherein said drain extension region extends to under said gate at said substrate face.

13. A field effect transistor according to claim 12 wherein said gate includes a first gate sidewall adjacent said source region and a second gate sidewall adjacent said drain region, said field effect transistor further comprising:

a source sidewall spacer on said first gate sidewall and extending onto said substrate face, said source region extending to under said source sidewall spacer at said substrate face; and a drain sidewall spacer on said second gate sidewall and extending onto said substrate face, said drain region extending to under said drain sidewall spacer at said substrate face.

14. A field effect transistor comprising:

a semiconductor substrate;

spaced apart source and drain regions of first conductivity type in said semiconductor substrate, at a face thereof;

a first region in said semiconductor substrate, having a first predetermined doping concentration of second conductivity type, and extending from one of said source and drain regions towards the other of said source and drain regions, at a predetermined depth from said substrate face;

a second region surrounding said first region, said second region having decreasing doping concentration of said second conductivity type from said first region towards said substrate face, from said first region away from said substrate face and from said first region towards said other of said source and drain regions;

a gate on said semiconductor substrate face, between said spaced apart source and drain regions; and source, drain and gate electrodes for contacting said source and drain regions and said gate, respectively;

wherein said one of said source and drain regions extends a second predetermined depth from said substrate face and said first predetermined depth is less than said second predetermined depth.

15. A field effect transistor comprising:

a semiconductor substrate;

spaced apart source and drain regions of first conductivity type in said semiconductor substrate, at a face thereof;

a first region in said semiconductor substrate, having a first predetermined doping concentration of second conductivity type, and extending from one of said source and drain regions towards the other of said source and drain regions, at a predetermined depth from said substrate face;

a second region surrounding said first region, said second region having decreasing doping concentration of said second conductivity type from said first region towards said substrate face, from said first region away from said substrate face and from said first region towards said other of said source and drain regions;

a gate on said semiconductor substrate face, between said spaced apart source and drain regions; and source, drain and gate electrodes for contacting said source and drain regions and said gate, respectively;

wherein said one of said source and drain regions extends a second predetermined depth from said substrate face and said first predetermined depth is about one half said second predetermined depth.

16. A field effect transistor according to claim 14 wherein said gate comprises:

a gate insulator on said substrate face, between said spaced apart source and drain regions; and a gate contact on said gate insulator, opposite said substrate face, said gate electrode contacting said gate contact.

17. A field effect transistor according to claim 14 further comprising:

an extension region of said first conductivity type in said semiconductor substrate at said face, and extending from said one of said source and drain regions towards said other of said source and drain regions;

said second region having decreasing doping concentration of said second conductivity type from said first region towards said extension region, from said first region away from said extension region and from said first region towards said other of said source and drain regions.

18. A field effect transistor according to claim 17:
wherein said extension region is lightly doped relative to said one of said source and drain regions.

19. A field effect transistor according to claim 17:
wherein said extension region extends to under said gate at said substrate face.

20. A field effect transistor according to claim 19 wherein said gate includes a gate sidewall adjacent said one of said source and drain regions, said field effect transistor further comprising:

a sidewall spacer on said gate sidewall and extending onto said substrate face, said one of said source and drain regions extending to under said sidewall spacer at said substrate face.

21. A method of forming a field effect transistor comprising the steps of:

forming a gate on a face of a semiconductor substrate;

implanting ions of a first conductivity type into said face, using said gate as a mask, to form source and drain extension regions in said semiconductor substrate at said face;

implanting ions of second conductivity type into said face, using said gate as a mask, to form a pair of buried centroid regions beneath said face, and a pair of buried gradient regions, a respective one of which surrounds a respective one of said pair of buried centroid regions, and having doping density which decreases away from said buried centroid regions;

forming first and second gate sidewall spacers between said gate and said face and adjacent said source extension region and said drain extension region, respectively; and implanting ions of said first conductivity type into said face, using said gate and said first and said gate sidewall spacers as a mask, to form source and drain regions in said semiconductor substrate.

22. A method according to claim 21 wherein said step of implanting ions of a second conductivity type into said face, using said gate as a mask, precedes the step of implanting ions of first conductivity type into said face, using said gate as a mask.

23. A method according to claim 21 wherein the following step is performed prior to said step of implanting ions of second conductivity type:

forming first portions of said first and second gate sidewall spacers;

wherein said step of implanting ions of second conductivity type comprises the step of implanting ions of second conductivity type into said face, using said gate and said first portions of said first and second sidewall spacers as a mask, to form said pair of buried centroid regions, and said pair of buried gradient regions;

wherein said gate sidewall pair forming step comprises the step of forming second portions of said first and second gate sidewall spacers on said first portions of said first and second gate sidewall spacers; and wherein said step of implanting ions of said first conductivity type into said face, using said gate and said pair of gate sidewalls as a mask comprises the step of implanting ions of said first conductivity type into said face, using said gate and said first and second portions of said first and second gate sidewall spacers as a mask, to form source and drain regions in said semiconductor substrate.

* * * * *